United States Patent
Yamamoto

(10) Patent No.: US 10,872,853 B2
(45) Date of Patent: Dec. 22, 2020

(54) MODULE

(71) Applicant: Murata Manufacturing Co., Ltd., Kyoto (JP)

(72) Inventor: Issei Yamamoto, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 78 days.

(21) Appl. No.: 16/152,920

(22) Filed: Oct. 5, 2018

(65) Prior Publication Data
US 2019/0051594 A1 Feb. 14, 2019

Related U.S. Application Data

(63) Continuation of application No. PCT/JP2017/007702, filed on Feb. 28, 2017.

(30) Foreign Application Priority Data

Apr. 11, 2016 (JP) .................................. 2016-078591

(51) Int. Cl.
*H01L 23/28* (2006.01)
*H01L 23/498* (2006.01)
(Continued)

(52) U.S. Cl.
CPC ...... *H01L 23/49838* (2013.01); *H01L 21/565* (2013.01); *H01L 23/13* (2013.01);
(Continued)

(58) Field of Classification Search
CPC ..... H01L 2924/181; H01L 2224/45565; H01L 23/3121; H01L 21/56; H01L 31/3107; H01L 23/28
(Continued)

(56) References Cited

U.S. PATENT DOCUMENTS 6,104,095 A * 8/2000 Shin ..................... H01L 23/13
257/787
6,124,637 A * 9/2000 Freyman ............. H01L 23/3128
257/692
(Continued)

FOREIGN PATENT DOCUMENTS

JP 2002-100707 A 4/2002
JP 2003-77946 A 3/2003
(Continued)

OTHER PUBLICATIONS

International Search Report for International Application No. PCT/JP2017/007702 dated Apr. 18, 2017.
(Continued)

*Primary Examiner* — S. V. Clark
(74) *Attorney, Agent, or Firm* — Pearne & Gordon LLP

(57) ABSTRACT

A module with high reliability is provided by inhibiting occurrences of air bubbles caused with rise in flow resistance of resin when a sealing resin layer is formed using a die. A module includes a wiring board, components mounted over an upper face of the wiring board, and a sealing resin layer laminated over the upper face. On the upper face, the sealing resin layer includes a high-level region with a long distance from the upper face of the wiring board, a low-level region with a short distance from the upper face, and a level difference region. In a portion included in the wiring board and corresponding to the low-level region and the level difference region, a thin portion is formed so as to be thinner than the remaining portion and overlaps the low-level region at least partially in a plan view.

15 Claims, 3 Drawing Sheets

(51) Int. Cl.
  *H01L 25/18* (2006.01)
  *H01L 21/56* (2006.01)
  *H01L 23/13* (2006.01)
  *H01L 23/31* (2006.01)

(52) U.S. Cl.
  CPC .......... *H01L 23/3121* (2013.01); *H01L 25/18* (2013.01); *H01L 2224/16225* (2013.01); *H01L 2924/15159* (2013.01); *H01L 2924/181* (2013.01); *H01L 2924/19105* (2013.01)

(58) Field of Classification Search
  USPC ........................................ 257/684, 687, 787
  See application file for complete search history.

(56) References Cited

U.S. PATENT DOCUMENTS

| | | | | |
|---|---|---|---|---|
| 6,278,177 | B1* | 8/2001 | Ryu | H01L 21/568 257/678 |
| 7,741,725 | B2* | 6/2010 | Tamaki | H01L 21/561 257/787 |
| 2003/0045030 | A1 | 3/2003 | Hayashida et al. | |
| 2004/0232566 | A1* | 11/2004 | Mita | H01L 23/13 257/787 |

FOREIGN PATENT DOCUMENTS

| | | |
|---|---|---|
| JP | 2005-142452 A | 6/2005 |
| JP | 2005-209699 A | 8/2005 |
| JP | 2008-53612 A | 3/2008 |
| JP | 2009-99816 A | 5/2009 |

OTHER PUBLICATIONS

Written Opinion for International Application No. PCT/JP2017/007702 dated Apr. 18, 2017.

* cited by examiner

MODULE

This is a continuation of International Application No. PCT/JP2017/007702 filed on Feb. 28, 2017 which claims priority from Japanese Patent Application No. 2016-078591 filed on Apr. 11, 2016. The contents of these applications are incorporated herein by reference in their entireties.

BACKGROUND

Technical Field

The present disclosure relates to modules with resin layers that seal components mounted over wiring boards.

A conventional module is known, where components are mounted over a wiring board using solder. Such a module is provided with sealing resin so as to for example, protect the components mounted on the wiring board. Such a module is built in an electronic apparatus and desired to be smaller in size with recent decrease in the size and thickness of an electronic apparatus. Thus, a level difference may be given to a sealing resin layer by for example, making the thickness of a sealing resin layer in a portion where no components are mounted smaller than that in a portion where components are mounted.

As illustrated in FIG. 5, for example, a semiconductor module 100 described in Patent Document 1 includes a die pad portion 101, a semiconductor element 102 mounted over the die pad portion 101, a plurality of lead portions 103 arrayed around the die pad portion 101, metallic fine wires 104 that connect an electrode of the semiconductor element 102 and the plurality of lead portions 103, and sealing resin 105 that seals connection regions of the metallic fine wires 104. At least part of the edge portion of the sealing resin 105 is formed so as to be thinner than the central portion where the semiconductor element 102 is mounted. Accordingly, other components and wires can be arranged in free space created by decreasing the thickness of a sealing resin layer when a module is installed in an electronic apparatus, and as a result, adaptability to downsizing of an electronic apparatus is brought.

Patent Document 1: Japanese Unexamined Patent Application Publication No. 2005-209699 (see paragraphs 0028 and 0029, FIG. 1, etc.)

BRIEF SUMMARY

When the sealing resin 105 of the conventional semiconductor module 100 is formed, for example, a resin sealing method called transfer molding can be used, by which resin is poured into a die to be solidified. Currently, the technique of mold underfill (MUF) is also used, in which transfer molding is performed not only for a surface of the components mounted over a substrate but also for underfilling between the substrate and the components. MUF has an advantage of bringing a capability to cut process costs.

Such a shape as the sealing resin 105 of the semiconductor module 100, however, decreases a gap between the die used in the transfer molding and the wiring board in the portion where the sealing resin 105 is formed so as to be thin. Thus, in the portion where the thickness of the sealing resin layer is small, the flow resistance of the resin in the pouring of the resin increases and the flow velocity of the resin decreases. Then, air bubbles can be caused easily in the portion where the thickness of the sealing resin layer is small and accordingly, a problem arises that the reliability of the semiconductor module 100 decreases.

The present disclosure has been made in view of the above-described issue and is aimed at reducing occurrences of air bubbles in a module where a level difference is formed in a sealing resin layer that seals components and at increasing reliability.

To achieve the above-described aim, a module according to the present disclosure includes a wiring board, a component mounted over a principal face of the wiring board, and a sealing resin layer that is laminated over the principal face of the wiring board and covers the component, where on an opposite face of a face of the sealing resin layer toward the principal face of the wiring board, a high-level region with a long distance from the opposite face to the principal face, a low-level region with a short distance from the opposite face to the principal face, and a level difference region between the high-level region and the low-level region are provided, the wiring board includes a thin portion smaller in thickness than a remaining portion, and when viewed in a direction perpendicular to the principal face, the level difference region including the low-level region of the sealing resin layer overlaps the thin portion at least partially.

In this structure, a portion that is included in the wiring board and corresponds to the low-level region of the sealing resin layer is made as a thin portion and accordingly, when the sealing resin layer is formed using a die as in transfer molding for example, a gap in the low-level region of the sealing resin layer where resin flows is increased. Thus, flow resistance caused in pouring the resin into the die can be decreased and the flow velocity of the resin can be raised. As a result, occurrences of air bubbles in the low-level region of the sealing resin layer and between a component and the wiring board can be inhibited and a module with high reliability can be provided accordingly.

A sum of a projection area of the level difference region projected onto the principal face of the wiring board and an area of the low-level region may be larger than or equal to an area of the thin portion. In this case, while inhibiting occurrences of air bubbles in the formation of the sealing resin layer, an area for mounting components over the wiring board can be ensured.

A sum of a projection area of the level difference region projected onto the principal face of the wiring board and an area of the low-level region may be smaller than an area of the thin portion. In this case, a wide gap for pouring resin can be ensured and occurrences of air bubbles can be inhibited more effectively.

Further, a component may be mounted in the thin portion. In this case, while inhibiting occurrences of air bubbles, mounting density of the components mounted can be enhanced.

The low-level region and the thin portion may be formed along an edge of the wiring board, and a length of the low-level region along the edge may be approximately equal to a length of the thin portion along the edge. In this case, portions where the gap for pouring the resin is decreased can be reduced as much as possible and thus, the flow resistance of the resin can be decreased and occurrences of air bubbles can be inhibited.

The low-level region and the thin portion may be formed along an edge of the wiring board, and a length of the low-level region along the edge may be larger than a length of the thin portion along the edge. In this case, since the flow resistance of the resin can be decreased while an area for mounting components can be ensured so as to be as wide as possible, occurrences of air bubbles can be inhibited.

According to the present disclosure, a wide gap for pouring resin can be ensured in a module including a sealing resin layer, where a portion formed so as to be thin is present, by making a thin portion in a portion that is included in the wiring board and corresponds to the portion where the sealing resin layer is formed so as to be thin and thus, occurrences of air bubbles can be inhibited and a module with high reliability can be provided.

DETAILED DESCRIPTION

First Embodiment

Figure 1:
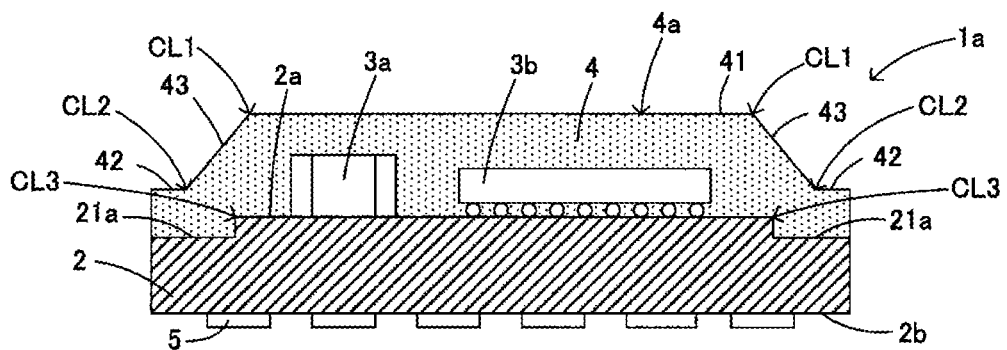
FIG. 1 is a cross-sectional view of a module according to a first embodiment of the present disclosure.

A module 1a according to a first embodiment of the present disclosure is described with reference to FIGS. 1 and 2. FIG. 1 is a cross-sectional view of the module 1a and FIGS. 2A and 2B are plan views of a wiring board 2 of the module 1a in FIG. 1.

As illustrated in FIG. 1, the module 1a according to the first embodiment of the present disclosure includes the wiring board 2, a plurality of components 3a and 3b mounted over an upper face 2a of the wiring board 2 (which corresponds to a principal face of a wiring board in the present disclosure), and a sealing resin layer 4 laminated over the upper face 2a of the wiring board 2, and is placed over a motherboard of an electronic apparatus for example.

The sealing resin layer 4 is laminated over the wiring board 2 so as to cover the upper face 2a of the wiring board 2 and each of the components 3a and 3b. On the upper face 4a, the sealing resin layer 4 includes a high-level region 41 with a long distance from the upper face 2a of the wiring board 2, a low-level region 42 with a short distance from the upper face 2a, and a level difference region 43, and a level difference is formed on the upper face 4a. The sealing resin layer 4 can be formed from resin that is typically employed as sealing resin, such as epoxy resin containing a silica filler. An alumina filler is also usable for high-temperature conduction. As illustrated in FIGS. 2A and 2B, when viewed in a direction perpendicular to the upper face 2a of the wiring board 2, the level difference on the upper face 4a of the sealing resin layer is formed in an edge portion of the wiring board 2 and formed along the sides of the wiring board 2, which is rectangular.

The wiring board 2 is a printed circuit board (PCB) for example, and electrodes (not illustrated) for mounting the components 3a and 3b and a surface layer conductor (not illustrated) are formed on the upper face 2a of the wiring board 2 while outer electrodes 5 for external connection are formed on a lower surface 2b. The wiring board 2 includes a thin portion 21a, which is formed in an edge portion so as to be thinner than the remaining portion in a plan view. In this case, the thin portion 21a is formed along each side of the upper face 2a of the wiring board 2.

In a plan view, the thin portion 21a is formed so as to overlap the low-level region 42 of the sealing resin layer 4 at least partially. Specifically, as illustrated in FIG. 2A, each of a high-level boundary CL1, which is a boundary between the high-level region 41 and the level difference region 43 of the sealing resin layer 4, a low-level boundary CL2, which is a boundary between the low-level region 42 and the level difference region 43 of the sealing resin layer, and a board boundary CL3, which is a boundary between the thin portion 21a and the remaining portion of the wiring board 2, forms a rectangle in a plan view. The rectangle of the low-level boundary CL2 is formed so as to have an area larger than that of the rectangle of the high-level boundary CL1 and is positioned so that, in a plan view, the high-level boundary CL1 is in an inner side portion of the low-level boundary CL2. The rectangle of the board boundary CL3 is positioned between the rectangle of the high-level boundary CL1 and the rectangle of the low-level boundary CL2.

Further, through the formation of the boundaries CL1, CL2, and CL3 along the edge (all of the four sides) of the upper face 2a of the wiring board 2, the length of the low-level boundary CL2 (which corresponds to "a length along an edge of the low-level region" in the present disclosure) is approximately equal to the length of the board boundary CL3 (which corresponds to "a length along an edge of the thin portion" in the present disclosure).

Owing to such positions of the boundaries CL1, CL2, and CL3, in a plan view, the sum of the projection area of the level difference region 43 projected onto the upper face 2a of the wiring board 2 and the area of the low-level region 42 is larger than the area of the thin portion 21a. In other words, the high-level boundary CL1 is positioned in an inner side portion of the board boundary CL3 and the low-level boundary CL2 is positioned in an outer side portion of the board boundary CL3 and accordingly, in a plan view, the low-level region 42 and the level difference region 43 of the sealing resin layer 4 (which correspond to "the level difference region including the low-level region" in the present disclosure) overlap the thin portion 21a of the wiring board 2 partially.

Figure 2A:
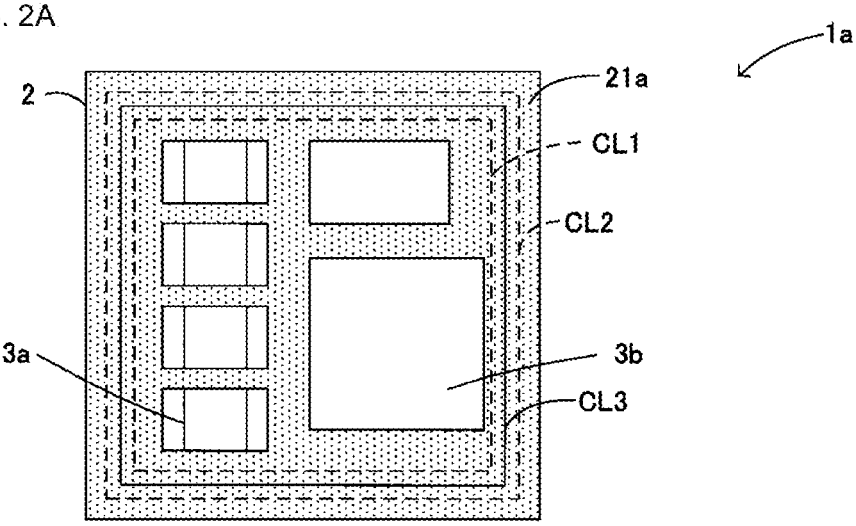
FIGS. 2A and 2B are plan views of the module in FIG. 1.
Figure 2B:
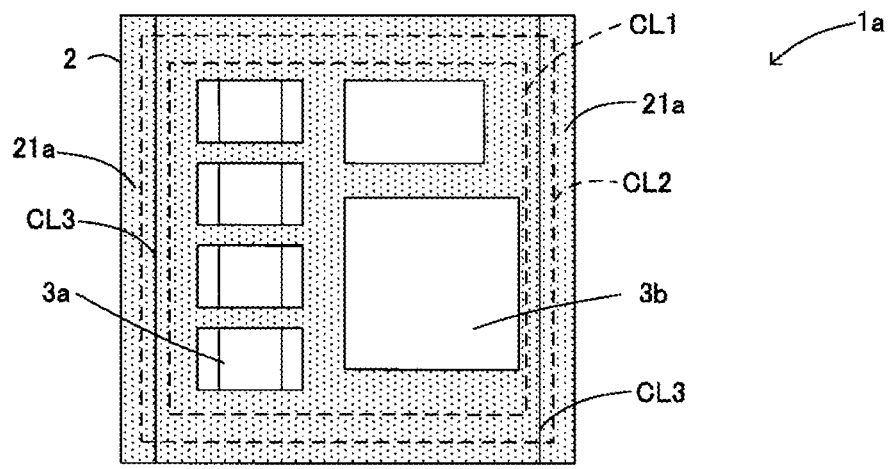

The portion where the thin portion of the wiring board 2 is formed is not limited thereto but may be changed, depending on the structure for arranging the components by for example, forming the level difference only on one pair of the sides that are included in the four sides of the wiring board 2 and face each other as illustrated in FIG. 2B or depressing a central portion.

The outer electrode 5 is formed from metal typically employed as a wiring electrode, such as Cu, Ag, or Al. The outer electrode 5 may undergo Ni/Au plating.

Each of the components 3a and 3b may be constituted by a semiconductor element formed using a semiconductor of Si, GaAs, or the like, or by a chip component, such as a chip inductor, a chip capacitor, or a chip resistor.

(Method of Manufacturing Module)

A method of manufacturing the module 1a is described below. First, the wiring board 2 is prepared, which includes the thin portion 21a smaller in board thickness than the remaining portion (the high-level region 41) in a portion corresponding to the portion that is included in the sealing resin layer 4 and formed so as to be thin (the low-level region 42 and the level difference region 43). An electrode for mounting a component, the outer electrodes 5, and the like are formed on the wiring board 2. Examples of the formation of the thin portion 21a include a method of removing a solder resist or a copper foil in the portion where the thin portion 21a is formed or hollowing a prepreg when the wiring board 2 is a printed circuit board. Although a typical thickness of the solder resist, copper foil, or prepreg is in a range from 15 to 20 µm, in the present embodiment, the thin portion 21a can be formed so as to be thinner than the remaining portion by approximately 10 to 200 µm by removing the portion corresponding to the thin portion 21a by one to five layers as needed.

After that, the components 3a and 3b are mounted over the upper face 2a of the wiring board 2 using a surface mount technology, such as by solder mounting. When necessary, the board may be cleaned after reflow.

After that, the sealing resin layer 4 is laminated over the upper face 2a of the wiring board 2 so as to cover each of the components 3a and 3b. The sealing resin layer 4 can be formed by transfer molding. It is assumed that, for example, in a manufacture method by which a module assembly with the modules 1a arrayed in a matrix is completed and separated in the end, resin is poured in a direction from the left to the right of FIG. 2B when the sealing resin layer 4 is formed by transfer molding. In this case, the flow resistance of the resin is large between the modules 1a next to each other in the direction in which the resin is poured. Thus, in the portion that is included in the wiring board 2 and corresponds to the low-level region 42 of the sealing resin layer 4, the thin portion 21a is formed only in a portion where the flow resistance of the resin is particularly large.

That is, as illustrated in FIG. 2B, the thin portion 21a is formed only on the two sides that face each other on the left and right of the wiring board 2. In this case, it can be said that in a plan view, the length of the low-level region 42 of the sealing resin layer 4 along the edge of the wiring board 2 is larger than the length of the thin portion 21a along the edge of the wiring board 2. As described above, providing the thin portion 21a can increase the gap between the die and the wiring board 2 in the portion where the flow resistance of the resin is particularly large and thus, occurrences of air bubbles can be inhibited effectively. Further, mounting density can be enhanced by mounting components in locations where the thin portion 21a is not formed. When necessary, plasma cleaning may be performed on the wiring board 2 before forming the sealing resin layer 4.

The alignment of the die used for the transfer molding and the wiring board 2 can be performed by inserting pilot pins of the die into alignment holes (not illustrated) of the wiring board 2. The alignment enables the portions of the die that correspond to the low-level region 42 and the level difference region 43 of the sealing resin layer 4 to face the thin portion 21a of the board. The surface roughness of the die can be changed, depending on the demands of a product. To prevent a scuff or the like on the sealing resin layer 4 from becoming outstanding, the arithmetic average roughness is desirably caused to be in a range from approximately 2 to 40 µm.

In addition, when necessary, solder bumps may be formed for the outer electrodes 5 of the wiring board 2. The height of the solder bump is in a range from approximately 30 to 120 µm. The formation is performed by reflow after solder printing.

After that, the module 1a is completed through separation by cutting with a dicing machine, laser machining, or the like. A shield film is formed over the module 1a after the separation by such a method as spattering or spin coating. The shield film may be connected to a ground layer of the board. When formed by spattering for example, the shield film can be constituted of a plurality of layers. In this case, for example, the shield film can be formed so as to have a three-layer structure of a close contact layer, which is formed from SUS or the like, a conductive layer, which is formed from Cu or the like, and a corrosion-resistant layer, which is formed from SUS or the like.

Accordingly, the above-described embodiment can ensure a wide gap for resin to flow by making the thin portion 21a in the wiring board 2 when the sealing resin layer 4 is formed by transfer molding. Thus, occurrences of air bubbles can be inhibited as a result of decrease in the flow resistance of the resin and rise in the flow velocity of the resin, and the module 1a with high reliability can be provided.

Further, in the present embodiment, since the sum of the projection area of the level difference region 43 projected onto the upper face 2a of the wiring board 2 and the area of the low-level region 42 is larger than the area of the thin portion 21a in a plan view, in addition to the above-described effects, a component mount area can be ensured in the wiring board 2 and the degree of flexibility in mounting the components can be increased.

Moreover, when the length of the low-level region 42 along the edge of the wiring board 2 is approximately equal to the length of the thin portion 21a along the edge of the wiring board 2 as in FIG. 2A, portions where the gap for pouring the resin is decreased can be reduced as much as possible, occurrences of air bubbles can be inhibited more effectively.

(Variation of Component Arrangement)

Figure 3:
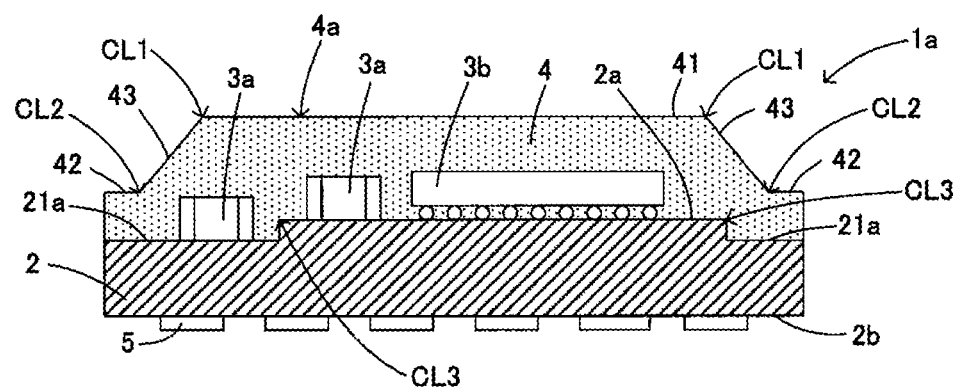
FIG. 3 illustrates a variation of the module in FIG. 1.

As illustrated in FIG. 3, the sum of the projection area of the level difference region 43 projected onto the upper face 2a of the wiring board 2 and the area of the low-level region 42 may be smaller than the area of the thin portion 21a. That is, the high-level boundary CL1 and the low-level boundary CL2 are positioned further in an outer side portion of the board boundary CL3. The component 3a or 3b may be mounted in the thin portion 21a. In this case, the above-described effects of the embodiment can be obtained without necessarily decreasing the number of components mounted.

Second Embodiment

Figure 4:
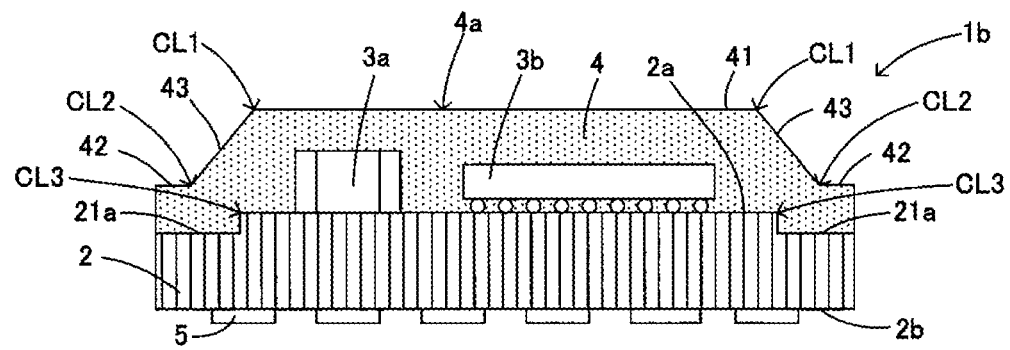
FIG. 4 is a cross-sectional view of a module according to a second embodiment of the present disclosure.
Figure 5:
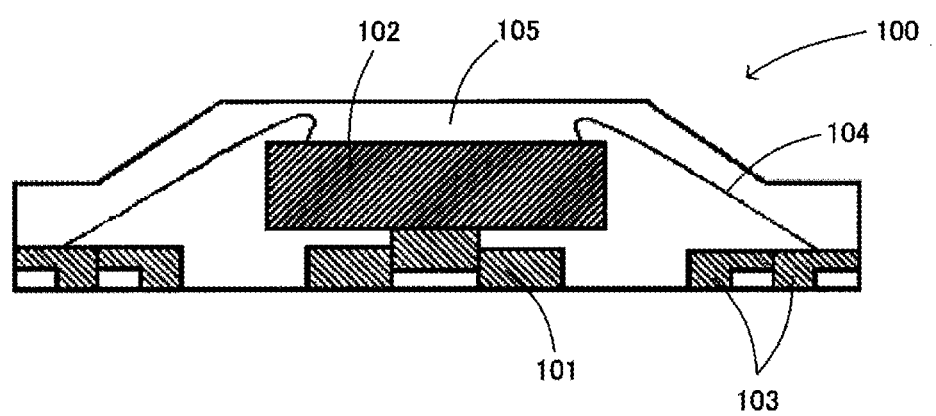
FIG. 5 is a cross-sectional view of a conventional module.

A module 1b according to a second embodiment of the present disclosure is described with reference to FIG. 4. FIG. 4 is a cross-sectional view of the module 1b.

The module 1b according to the present embodiment is different compared to the first embodiment described with reference to FIGS. 1 and 2 in that a wiring board 2 is a low temperature co-fired ceramics (LTCC) board as illustrated in FIG. 4. The other structures are the same as those of the module 1a in the first embodiment and the descriptions thereof are thus omitted by allocating the same reference signs.

As illustrated in FIG. 4, in the present embodiment, the wiring board 2 is formed from LTCC. Similar to the case in the first embodiment, mount electrodes (not illustrated) for mounting components 3a and 3b and a surface layer conductor (not illustrated) are formed on an upper face 2a of the wiring board 2 and outer electrodes 5 for external connection are formed on a lower surface 2b. In the present embodiment, the wiring board 2 has a multilayer structure, in which a wiring electrode (not illustrated), a ground electrode (not illustrated), and a via conductor (not illustrated) are formed. The wiring board 2 may be constituted by a multilayer board from high temperature co-fired ceramics (HTCC).

(Method of Manufacturing Module)

A method of manufacturing the module 1b is described below. First, a LTCC green sheet is made. In making the green sheet, ceramic powder, a binder, and a plasticizer are mixed by given amounts to make a slurry, and the slurry is applied onto a carrier film to be formed as a sheet. A lip coater, a doctor blade, or the like may be used for the application of the slurry.

After that, via holes (not illustrated) for vertical continuity are formed in the made LTCC green sheet. A mechanical punch, a $CO_2$ laser, a UV laser, or the like may be used for the formation of the via holes. The diameter of the via hole may have a given size, which is in a range from approximately 20 to 200 μm. A conductive paste that contains conductive powder, a plasticizer, and a binder is filled into the formed via holes. A co-base material (ceramic powder) for shrinkage adjustment may be added to the conductive paste.

After that, a circuit pattern is printed on the LTCC green sheet where the via conductors are formed. A conductive paste for circuit formation, which contains conductive powder, a plasticizer, and a binder, is used for the printing of the circuit pattern. A co-base material (ceramics and glass) for shrinkage adjustment may be added to a conductive paste for the ground electrode. The technique of screen printing, ink jet, gravure printing, or the like can be used for the printing of the circuit pattern.

After that, the portion of the LTCC green sheet corresponding to a thin portion 21a is hollowed using a laser, a mechanical punch, or a pinnacle blade so that the thin portion 21a smaller in board thickness than the remaining portion is formed in the portion corresponding to the portion that is formed in a sealing resin layer 4 so as to be thin.

After that, the green sheet on which the circuit pattern is printed is laminated into a given number of lamination layers, which depends on the thickness of a product, to form a ceramic block. Since a typical thickness of the LTCC green sheet is in a range from approximately 10 to 20 μm, the thin portion 21a thinner than the remaining portion by approximately 10 to 150 μm can be formed by hollowing one to five layers.

After that, the ceramic block is put into a die to be crimped with a given pressure and temperature. The crimped ceramic block is fired and the wiring board 2 is completed. As the firing furnace, a batch furnace or a belt furnace may be used. When a Cu-based paste is used, the firing is performed in a reductive atmosphere. When necessary, plating may be performed after the firing, such as Ni/Sn plating or electroless Au plating.

The components 3a and 3b are mounted over the completed wiring board 2 using a surface mount technology, such as by solder mounting. Further, the outer electrodes 5 are formed on the lower surface 2b of the wiring board 2.

After that, the sealing resin layer 4 is laminated over the upper face 2a of the wiring board 2 so as to cover each of the components 3a and 3b. The sealing resin layer 4 is formed by transfer molding. When necessary, plasma cleaning may be performed on the wiring board 2 before forming the sealing resin layer 4. Further, the alignment of the die used for the transfer molding and the wiring board 2 can be performed by inserting pilot pins of the die into alignment holes (not illustrated) of the wiring board 2. The alignment enables the portions of the die that correspond to a low-level region 42 and a level difference region 43 of the sealing resin layer 4 to face the thin portion 21a of the board. The surface roughness of the die can be changed, depending on the demands of a product. To prevent a scuff or the like on the sealing resin layer 4 from becoming outstanding, the arithmetic average roughness is desirably caused to be in a range from approximately 2 to 40 μm.

After that, when necessary, solder bumps may be formed for the outer electrodes 5 of the wiring board 2. The height of the solder bump is in a range from approximately 30 to 120 μm. The formation is performed by reflow after solder printing.

After that, the module 1b is completed through separation by cutting with a dicing machine, laser machining, or the like. A shield film may be formed over the module 1b after the separation by such a method as spattering. The shield film may be connected to a ground layer of the board. The shield film can be constituted of a plurality of layers. Typically, the shield film is formed so as to have a three-layer structure of a close contact layer, a conductive layer, and a corrosion-resistant layer.

Thus, the above-described embodiment can bring similar effects to those in the case in the first embodiment.

The present disclosure is not limited to the above-described embodiments but can be changed in various other ways than what is described above within the scope not departing from the gist of the present disclosure. For example, the structures in the above-described embodiments and variation may be combined.

For example, although the low-level region 42 of the sealing resin layer 4 is formed on all of the sides, which constitute the edge portion of the rectangular module 1a in the above-described embodiments, the low-level region 42 and the level difference region 43 may be formed in part of the edge portion of the module 1a or a different portion than the edge portion. Further, although the level difference region 43 is a sloping face in the above-described embodiments, the level difference region 43 may be a perpendicular face instead of being a sloping face. Although in the above-described embodiments, the plurality of components 3a and 3b are mounted over the wiring board 2, the number of components mounted over the wiring board 2 may be one or more. Further, the level difference region 43, the low-level region 42, the thin portion 21a may be formed so that the sum of the projection area of the level difference region 43 projected onto the upper face 2a of the wiring board 2 and the area of the low-level region 42 is equal to the area of the thin portion 21a.

INDUSTRIAL APPLICABILITY

The present disclosure is applicable to various modules with sealing resin for covering components mounted over wiring boards.

REFERENCE SIGNS LIST 1a, 1b Module
2 Wiring board
21a Thin portion
3a, 3b Component
4 Sealing resin layer
41 High-level region
42 Low-level region
43 Level difference region

The invention claimed is:
1. A module comprising:
a wiring board;
a component mounted over a principal face of the wiring board; and
a sealing resin layer that is laminated over the principal face of the wiring board and covers the component, wherein:
on an opposite face of the sealing resin layer opposite to the principal face of the wiring board, a high-level region has a long distance from the opposite face to the principal face of the wiring board, a low-level region has a short distance from the opposite face to the principal face of the wiring board, and a level difference region is between the high-level region and the low-level region, the wiring board includes a thin portion smaller in thickness than a remaining portion, the component is mounted in the thin portion, and when viewed in a direction perpendicular to the principal face of the wiring board, at least part of the level difference region and the low-level region of the sealing resin layer overlaps the thin portion.

2. The module according to claim 1, wherein a sum of a projection area of the level difference region projected onto the principal face of the wiring board and an area of the low-level region is larger than or equal to an area of a surface of the thin portion facing the sealing resin layer.

3. The module according to claim 1, wherein a sum of a projection area of the level difference region projected onto the principal face of the wiring board and an area of the low-level region is smaller than an area of a surface of the thin portion facing the sealing resin layer.

4. The module according to claim 1, wherein an edge of the low-level region and an edge of the thin portion are formed along an edge of the wiring board, and a length of the low-level region along the edge of the wiring board is approximately equal to a length of the thin portion along the edge of the wiring board.

5. The module according to claim 1, wherein an edge of the low-level region and an edge of the thin portion are formed along an edge of the wiring board, and a length of the low-level region along the edge of the wiring board is larger than a length of the thin portion along the edge of the wiring board.

6. A module comprising:

a wiring board;

a component mounted over a principal face of the wiring board; and a sealing resin layer that is laminated over the principal face of the wiring board and covers the component, wherein:

on an opposite face of the sealing resin layer opposite to the principal face of the wiring board, a high-level region has a long distance from the opposite face to the principal face of the wiring board, a low-level region has a short distance from the opposite face to the principal face of the wiring board, and a level difference region is between the high-level region and the low-level region, the wiring board includes a thin portion smaller in thickness than a remaining portion, a difference in thickness between the remaining portion and the thin portion is less than the short distance of the low-level region, and when viewed in a direction perpendicular to the principal face of the wiring board, at least part of the level difference region and the low-level region of the sealing resin layer overlaps the thin portion.

7. The module according to claim 6, wherein an edge of the low-level region and an edge of the thin portion are formed along an edge of the wiring board, and a length of the low-level region along the edge of the wiring board is approximately equal to a length of the thin portion along the edge of the wiring board.

8. The module according to claim 6, wherein the low-level region and an edge of the thin portion are formed along an edge of the wiring board, and a length of the low-level region along the edge of the wiring board is approximately equal to a length of the thin portion along the edge of the wiring board.

9. The module according to claim 1, wherein the low-level region and the thin portion are formed along an edge of the wiring board, and a length of the low-level region along the edge is approximately equal to a length of the thin portion along the edge of the wiring board.

10. The module according to claim 6, wherein an edge of the low-level region and an edge of the thin portion are formed along an edge of the wiring board, and a length of the low-level region along the edge of the wiring board is larger than a length of the thin portion along the edge of the wiring board.

11. The module according to claim 1, wherein another component is mounted in the thin portion.

12. The module according to claim 6, wherein the component is mounted in the thin portion.

13. The module according to claim 12, wherein another component is mounted in the thin portion.

14. The module according to claim 6, wherein a sum of a projection area of the level difference region projected onto the principal face of the wiring board and an area of the low-level region is larger than or equal to an area of a surface of the thin portion facing the sealing resin layer.

15. The module according to claim 6, wherein a sum of a projection area of the level difference region projected onto the principal face of the wiring board and an area of the low-level region is smaller than an area of a surface of the thin portion facing the sealing resin layer.

* * * * *